United States Patent [19]
Kindl et al.

[11] Patent Number: 5,334,487
[45] Date of Patent: Aug. 2, 1994

[54] METHOD FOR FORMING A PATTERNED LAYER ON A SUBSTRATE

[75] Inventors: Thomas E. Kindl, Endwell; Ronald J. Moore, Binghamton; Paul G. Rickerl, Endicott, all of N.Y.

[73] Assignee: International Business Machines Corporation, Armonk, N.Y.

[21] Appl. No.: 918,989

[22] Filed: Jul. 23, 1992

[51] Int. Cl.$^5$ ............................................. G03F 7/00
[52] U.S. Cl. .................................... 430/312; 430/314; 430/318; 156/661.1
[58] Field of Search ............... 430/312, 314, 318, 313; 156/661.1

[56] References Cited

U.S. PATENT DOCUMENTS

| | | | |
|---|---|---|---|
| 3,799,816 | 3/1974 | Schneble, Jr. et al. | 156/644 |
| 4,107,351 | 8/1978 | James et al. | 427/43 |
| 4,247,623 | 1/1981 | Guild | 430/275 |
| 4,512,843 | 4/1985 | Miyazaki | 156/644 |
| 4,911,786 | 3/1990 | Kindl et al. | 156/659.1 |
| 4,965,700 | 10/1990 | McBride | 361/398 |
| 5,026,624 | 6/1991 | Day et al. | 430/280 |
| 5,122,439 | 6/1992 | Miersch et al. | 430/311 |
| 5,217,849 | 6/1993 | Chonan et al. | 430/314 |

OTHER PUBLICATIONS

IBM Tech. Disc. Bulletin vol. 31, No. 6, Nov. 1988, "Solder Mask Protective Coating for Flexible Printed Circuits" p. 144.

IBM Technical Discl. Bulletin, vol. 15, No. 2, Jul. 1972 "Chip Interconnection Device", p. 420.

*Primary Examiner*—Charles L. Bowers, Jr.
*Assistant Examiner*—John A. McPherson
*Attorney, Agent, or Firm*—Calfee, Halter & Griswold

[57] ABSTRACT

The present invention provides a method of forming a pattern of conductive material on dielectric material with access openings or vias through said dielectric material and such a structure. A sheet of conductive material, which is to be circuitized, is provided with a layer of a first photoimageable dielectric material on one face thereof. A layer of a second photoimageable material, such as a conventional photoresist material, is provided on the opposite face of the conductive material. The layer of said first photoimageable material is selected such that it will not be developed by the developer that develops the layer of said second material. The two layers of photoimageable material are patternwise exposed to radiation. The second layer of material is developed and the revealed underlying conductive material is etched to form the desired circuit pattern. The first layer is then developed to form openings or vias communicating with the circuit pattern, and these are then filled with a conductive material such as solder.

11 Claims, 1 Drawing Sheet

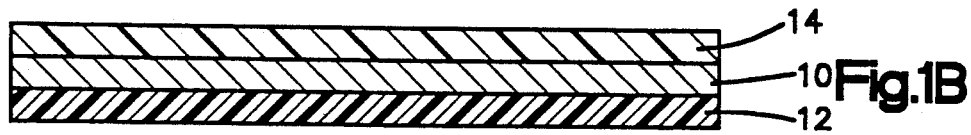
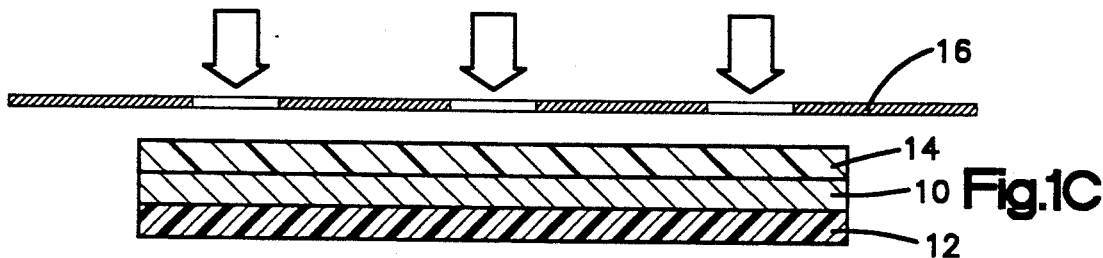
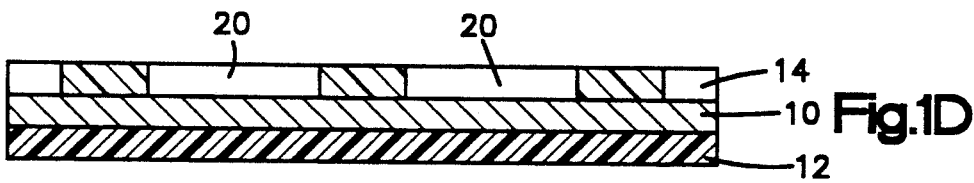
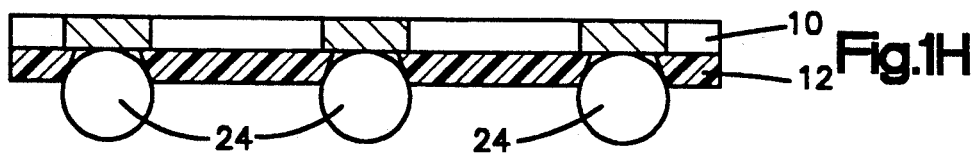

METHOD FOR FORMING A PATTERNED LAYER ON A SUBSTRATE

BACKGROUND OF THE INVENTION

1. Field of Invention

This invention relates generally to the formation of a patterned layer of material on a substrate, and more particularly to the formation of a circuitized conductor pattern on a dielectric material. In even more particular aspects, this invention relates to utilizing a photoimageable dielectric material as a substrate and using photo imaging techniques to both pattern the conductor material and also to provide openings or vias through such dielectric material for forming electrical connection to the circuitized pattern.

2. Description of the Prior Art

There have been many different techniques for forming circuit patterns on various types of dielectric substrates. Certain of these techniques employ a dielectric substrate on to which a layer of metal is applied. Photoimaging techniques utilizing photoresists are used in various ways to pattern the layer of conductive metal which is then etched to form a pattern of the desired circuit configuration. In some instances through holes or vias are required which extend through the dielectric substrate to allow formation of electrical contacts such as by solder balls to the underside of various locations of the circuitized conductive material. Frequently the required end product is a flexible type circuit which requires a thin film of flexible dielectric material which has provided thereon a thin film of flexible patterned metal as a circuit.

Some representative techniques for forming such patterns are shown in IBM Technical Disclosure Bulletin Volume 15 No. 2, July 1972, page 420, IBM Technical Disclosure Bulletin Volume 31 No. 6, November 1988, page 144, U.S. Pat. No. 4,512,843 assigned to Sumitomo Metal Mining Company Limited, and U.S. Pat. No. 4,911,786 assigned International Business Machines Corporation, assignee of the present invention.

SUMMARY OF THE INVENTION

According to the present invention a method of forming a pattern of conductive material on dielectric material with access openings or vias through said dielectric material and a structure of such materials is provided. A sheet of conductive material, which is to be circuitized, is provided with a layer of a first photoimageable dielectric material on one face thereof. A layer of a second photoimageable material, such as a conventional photoresist material, is provided on the opposite face of the conductive material. The layer of said first photoimageable material is selected such that it will not be developed by the developer that develops the layer of said second photoimageable material.

Both the first and second photoimageable materials are imagewise patterned, the layer of the second photoimageable material being imaged in the pattern to be formed on the conductive material and the layer of the first photoimageable material being imaged in a pattern of through openings or vias to be formed in the dielectric material. Thereafter, the second layer of material is developed to reveal the underlying conductive material. The revealed conductive material is then etched with a reagent, that will not substantially attack either of the photoimageable materials, to thereby form the desired circuitized pattern. The layer of said first material is then developed to form through openings or vias through the first material to communicate with the selected portions of the circuitized pattern. The remaining layer of the second photoimageable material may be removed preferably before developing the first photoimageable material and thereafter solder or other electrical connections are provided in the openings whereby a pattern of conductive material is formed on a dielectric material with openings extending through said dielectric photoimageable material and in which openings is disposed, solder or other conductive material.

DESCRIPTION OF THE DRAWING

FIGS. 1A though 1H are longitudinal sectional views, somewhat diagrammatic, depicting the various steps in the practice of this invention of providing a circuitized pattern on a dielectric substrate which substrate has solder filled openings therethrough.

DESCRIPTION OF THE PREFERRED EMBODIMENT

Referring now to the drawing, the various Figures show stepwise, and somewhat diagrammatically, the practice of the present invention of a method of forming a patterned layer of material upon a substrate and specifically, the formation of a circuitized conductive material pattern-wise formed on a dielectric substrate with vias or through holes extending through the substrate in which openings solder balls are provided for contact to the patterned layer of material.

In the preferred embodiment, the starting material is a sheet of copper foil 10 which will later be patterned and etched to form the required conductor pattern. The foil 10 may be from 0.25 mil to several mils in thickness, but preferably it is between about 0.5 and 1.0 mil thick. The foil may be formed either by electrodeposition or from rolled and annealed metal stock. The foil is preferably formed of copper or a copper alloy such as Beryllium copper (BeCu). However, the exact selection of the conductive material is dependent upon the final mechanical and electrical properties desired.

Both sides of the foil 10 preferably are treated with an adhesion enhancing finish, such as the proprietary process by Gould, Inc. of Eastlake, Ohio, in order to increase the bond strength between the copper foil 10 and the subsequently applied materials as will be described presently. This is specially preferable on the side of the foil 10 which is to eventually form the interface with dielectric substrate.

The metal foil 10 is then coated on one side with a layer of a photoimageable epoxy resin 12. The thickness of the epoxy may be from less than 1 mil to several mils, the preferred thickness range being from 1 to 2 mils. However, the exact thickness will depend on many things including the dielectric properties required, the mechanical properties and other considerations. The preferred epoxy material is described in U.S. Pat. No. 5,026,624, dated Jun. 25, 1991, entitled "Improved Composition for Photo Imaging". It has been found that this material is extremely well suited for this particular purpose and serves excellently both as a masking material for the etchant and a dielectric substrate material which is also solder resistant. Broadly, the preferred material is an epoxy resin which contains essentially from about 10% to about 80% by weight of a polyol resin which is a condensation product of epichlorohydrin and bisphenol A having a molecular weight between 40,000 and 130,000 and between 20% and 90% by weight of epoxidized octafunctional bisphenol A formaldehyde novolak resin having a molecular weight between about 4,000 and 10,000. Optionally, if flame retardancy is required the resin contains up to about 50% by weight of an epoxidized di-glycidal ether of tetrabromo bisphenol A having a melting point of between about 90° C. and 110° C. and a molecular weight of between about 600 and 2500. This resin has between about 0.1 and 15 parts by weight of resin of a cationic photoinitiator capable of initiating polymerization of the epoxidized resin system upon exposure to radiation, thus, making it a negative acting photoimageable material. A suitable polyol resin which a condensation product of epichlorohydrin and bisphenol A is a resin sold under the Trade Mark PKHC by Union Carbide Corporation. A suitable epoxidized octafunctional bisphenol A Formaldehyde novolak resin is sold under the Trade Mark EpiRez SU-8 by High Tek Polymers, Inc. A suitable epoxidized di-glycidal ether of tetrabromo bisphenol A is sold under the Trade Mark EpiRez 5183 by High Tek Polymers Corporation, Inc., and a suitable photoinitiator is a complex triaryl sulfonium hexafluoroantimonate salt sold by General Electric Co. under the Trade Mark UVE1014. The material may also optionally contain up to about 10 parts by weight of a photosensitizer such as anthracene or perylene or their derivatives. These materials are discussed in detail in said U.S. Pat. No. 5,026,624, which patent is specifically incorporated herein by reference as if it had been fully set out herein. The preferred resin is about 30% PKHC, about 45% EpiRez 5183 and about 25% SU-8 together with about 5 parts by weight UVE1014. If desired, a surfactant, such as FC 430 sold by 3M Corporation can be added in amounts up to 1 part per 100 by weight. For coloring purposes, if desired, various dyes such as Malachite Green, Ethyl violet, or Rhodamine B can be used in amounts up to about 1 part per 100 by weight.

The masking material 12 may be coated onto the foil 10 in any desired manner. It may be curtain coated as described in said U.S. Pat. No. 5,026,624. In such cases, the formulation of example 4 thereof is the preferred formulation. This formulation has 30% PKHC, 45% EpiRez 5183 and 25% SU-8 with 5 parts per weight of UVE1014. As indicated in said patent this sample is mixed with a propylene glycol monomethyl ether acetate (PGMEA) solvent with a formulation of about 40% solids in the PGMEA. However, for many applications of the material it is desired to use spray application in which case the formulation is further diluted. In any event the solvent PGMEA can be varied to obtain the best coating results. The coated composition is then dried to form a film 12 generally drying from about 3-7 minutes at 120° C. provides good results. This configuration is shown in FIG. 1A.

A second layer of a photoimageable composition 14 is then applied to the opposite side of the metal foil 10 as shown in FIG. 1B. The photoimageable material 14 must be selected such that whatever developer is used to develop this material 14, that developer will not develop the epoxy photoimageable material 12. The reason for this will become apparent presently. The preferred photoresist is a dry film photopolymer that can be heat laminated on to the surface of the copper by pressing the copper foil 10 clad with the epoxy material between a pair of heated rolls in contact with the dry photoresist. A particularly preferred type of photoresist is sold under the tradename "Riston" by E. I. DuPont & Co. The thickness of the photoresist layer 12 may be from 0.5 to 2 mils depending on the resolution and etch resistance requirements. Specially preferred is Riston 3100 which is negative acting resist and can be developed and stripped in aqueous based reagents.

At this stage in the processing both the photoresist material 14 and the photoimageable epoxy 12 are ready for exposure and development. The photoresist 14 is exposed through a mask 16 to actinic radiation and the photoimageable epoxy is exposed through a photo mask 18 to actinic radiation as shown in FIG. 1C. The exposure of the photoresist material 16 is in the pattern that will be etched into the copper foil 10 to form the circuitized layer of copper and the pattern which is exposed through the photomask 18 onto the photoimageable epoxy resin is in the pattern of the vias or throughholes that will be etched through the epoxy to provide access to the underside of the circuitized copper layer. The exposure can be done in sequential steps, i.e., first the exposure of the material 14 and then the exposure of the material 12 or vice versa. However, it is preferred that the exposure be done in a single step or at least in a single set up of the double clad material so that alignment between the two photomasks 16 and 18 is optimized.

The energy of each exposure is adjusted to give the optimal pattern in each of the two materials. The energy to expose the photoresist material 14 is in the 60-100 mJ/cm$^2$ range and the energy to expose the photoimageable epoxy material 12 is in the range of 750-1000 mJ/cm$^2$. It will be noted at this point that both the photoresist material 14 and the photoimageable epoxy 12 are exposed before either is developed.

At this point in the processing, the photoresist material 14 is developed in any suitable aqueous solution such as sodium carbonate as is well known. It will be noted that the sodium carbonate does not affect the photoimageable epoxy 12, and especially it does not develop those areas which are unexposed, the epoxy being essentially unreactive in either the exposed or unexposed condition to the sodium carbonate. This is to prevent exposure of the copper layer 10 through the epoxy 12 during subsequent etching operation. This development of the photoresist layer of material 14 will result in a structure as shown in FIG. 1D with openings 20 formed in the photoresist 14 exposing the areas of the foil 10 to be etched away. At this point the composite is baked at a temperature and time sufficient to prepare the photoimageable epoxy material 12 for later development, the baking being at about 140° C. for 30 minutes.

Before the epoxy material 12 is developed, it is necessary to etch the circuit pattern which has been transferred to the copper layer 10, which etching is done by any conventional means. It should be noted however that whatever means of etching is used it must be so selected that the photoimaged epoxy 12 is not attacked by the etching reagent or process to any significant extent. Preferably such an etching process is a wet etching process using an etchant comprised of about 39 to 44 percent by weight cupric chloride, 3.2 to 4.0 percent by weight hydrochloric acid, and the balance deionized water. The etching takes place preferably at a temperature of about 50° C. and will proceed at a rate and for a time determined by the copper layer thickness and grain structure and other parameters. The composite with the etched circuit pattern is shown in FIG. 1E.

It is preferred at this point in the processing to strip the remaining photoresist material 14 if it is not needed later, and generally it will not be. This stripping can be accomplished in an aqueous sodium hydroxide reagent as is well known which will result in the structure shown in FIG. 1F, since the photoimaged epoxy 12 is resistant to sodium hydroxide.

After stripping of the photoresist, the epoxy material 12 is developed using any suitable solvent mixture. The preferred developer is 100% butyrolactone with the contact time in the developer being sufficient to fully develop the unexposed material and provide vias or openings 22 as shown in FIG. 1G. A deionized water rinse follows the developing process. The preferred develop and rinse conditions for the preferred thickness are about 1 minute immersion in butyrolactone, followed by about 1 minute in butyrolactone spray, followed by 1 minute spray water rinse, followed by a 1 minute of radiant heat or hot air dry.

In order to achieve the optimum mechanical properties of the epoxy, a post development blanket exposure of the epoxy to at least 1,000 mJ/cm$^2$ followed by a bake at 110°–180°, preferably at about 150° C., for 30 minutes is preferred. Following this treatment, metallization electrical connections in the form of solder balls 24 can be applied to the openings 22 so as to provide the structure shown in FIG. 1H. This metallization of the through holes is conventional and can be done by wave soldering since the particular epoxy 12 selected also serves as a solder mask; or any other conventional process can be used to form conductors in the holes or vias 22. Alternately, pre-formed solder balls can be located in vias 22 and soldered to metal 10 by methods known in the art.

This metal structure can be further extended to have multiple layers, wherein successive additional layers of first metal, then epoxy dielectric are deposited, using wet or dry methods known in the art for metal deposition, and methods described previously herein for epoxy deposition.

Further, while the preferred embodiment of the invention is directed to providing a circuitized pattern on a dielectric substrate, it is broadly applicable to forming a patterned material generally, on a substrate material generally, with openings through the substrate communicating with the patterned material.

Although one embodiment of this invention has been shown and described, various adaptations and modifications can be made without departing from the scope of the invention as defined in the appended claims.

What is claimed is:

1. A method of forming a pattern of conductive material on a dielectric material with a plurality of access openings through said dielectric material communicating with the conductive material comprising the steps of:
    providing a sheet of conductive material which is to be patterned;
    providing a layer of a first photoimageable material on one face of said conductive material;
    providing a layer of a second photoimageable material on the other face of said conductive material;
    said layer of said first photoimageable material being a dielectric film forming material;
    the material of said layer of said first photoimageable material being developable by a developer which will not develop said second photoimageable material;
    imagewise patterning said layers of first and second photoimageable materials, said layer of said second photoimageable material being imaged in the pattern to be formed in said conductive material, said layer of said first photoimageable material being imaged in the pattern of the access openings to be formed in the first photoimageable material which will communicate with the conductive material;
    thereafter, developing said layer of said second photoimageable material to reveal the underlying conductive material;
    etching the revealed underlying conductive material to form a selected pattern therein with an etch media that will not substantially alter said layer of said first photoimageable material;
    developing said layer of said first photoimageable material to form a plurality of openings through said layer of first photoimageable material; whereby a pattern of conducting material is formed on a dielectric material with openings extending through said dielectric material to said patterned conductive material; and thereafter providing electrically conducting material in said access openings to thereby form discrete conductors in said access openings communicating with said pattern of conductive material.

2. The method as defined in claim 1 wherein the dielectric material is a solder resistant material, and the electrically conductive material is solder.

3. The method as defined in claim 1 wherein said layer of dielectric material is an epoxy.

4. The method as defined in claim 1 wherein said layer of second photoimageable material is a photoresist.

5. The method as defined in claim 4 wherein said layer of said second photoresist material is applied as a dry film.

6. The method as defined in claim 3 wherein said dielectric material is an epoxy solder resistant material.

7. The method as defined in claim 1 further characterized by removing the remainder of the layer of said second photoresist material remaining after etching of the conductive material.

8. The method as defined in claim 1 wherein the conductive material is copper or a copper alloy.

9. A method of forming a pattern of conductive material on a dielectric material with a plurality of access openings through said dielectric material communicating with the conductive material comprising the steps of:
    providing a sheet of conductive material which is to be patterned;
    providing a layer of a first photoimageable material on one face of said conductive material;
    providing a layer of a second photoimageable material on the other face of said conductive material;
    said layer of said first photoimageable material being a dielectric film forming material;
    the material of one of said layers of material being developable by a developer which will not develop the other layer of said material;
    imagewise patterning said first and second layers of photoimageable material, said layer of said second photoimageable material being imaged in the pattern to be formed in said conductive material, said layer of said first photoimageable material being imaged in the pattern of the through openings to be formed in the first photoimageable material;

developing said layer of the second photoimageable material to reveal the underlying conductive material;

developing said layer of the first photoimageable material to form openings through said layer of first photoimageable material;

said process being further characterized by etching the conductive material revealed upon developing of said layer of said second photoimageable material with an etch media that will not substantially alter said layer of said first photoimageable material, said etching taking place before the layer of first photoimageable material is developed;

whereby a pattern of conducting material is formed on a dielectric material with openings extending through said dielectric material to said patterned conductive material; and thereafter providing electrically conducting material in said access openings to thereby form discrete conductors in said access openings communicating with said pattern of conductive material.

10. The method as defined in claim 9 wherein said solder resistant dielectric material is an epoxy.

11. The method as defined in claim 9 wherein said first photoimageable material is solder resistant and said electrical conducting material is solder.

* * * * *